United States Patent
Lobinger et al.

(10) Patent No.: US 9,009,572 B2
(45) Date of Patent: Apr. 14, 2015

(54) METHOD FOR ADAPTING THE DATA BLOCKS TO BE SUPPLIED TO A TURBO CODER AND CORRESPONDING COMMUNICATIONS APPARATUS

(75) Inventors: Andreas Lobinger, Miesbach (DE); Bernhard Raaf, Munich (DE); Ralf Wiedmann, Munich (DE)

(73) Assignee: Siemens Aktiengesellschaft, Munich (DE)

(*) Notice: Subject to any disclaimer, the term of this patent is extended or adjusted under 35 U.S.C. 154(b) by 777 days.

(21) Appl. No.: 10/204,608

(22) PCT Filed: Jan. 12, 2001

(86) PCT No.: PCT/DE01/00110
§ 371 (c)(1),
(2), (4) Date: Aug. 22, 2002

(87) PCT Pub. No.: WO01/63773
PCT Pub. Date: Aug. 30, 2001

(65) Prior Publication Data
US 2003/0014715 A1    Jan. 16, 2003

(30) Foreign Application Priority Data
Feb. 22, 2000  (DE) .................... 100 08 064

(51) Int. Cl.
*H03M 13/00*    (2006.01)
*H03M 13/03*    (2006.01)
*H03M 13/29*    (2006.01)
*H03M 13/37*    (2006.01)

(52) U.S. Cl.
CPC ...... *H03M 13/6356* (2013.01); *H03M 13/2903* (2013.01); *H03M 13/2957* (2013.01); *H03M 13/37* (2013.01); *H03M 13/6362* (2013.01)

(58) Field of Classification Search
USPC .......................................... 714/774, 789, 790
See application file for complete search history.

(56) References Cited

U.S. PATENT DOCUMENTS

| | | | | | |
|---|---|---|---|---|---|
| 4,293,951 | A | * | 10/1981 | Rhodes | .......... 714/786 |
| 5,889,791 | A |   | 3/1999  | Yang   |   |
| 6,370,669 | B1| * | 4/2002  | Eroz et al. | ...... 714/774 |
| 6,437,714 | B1| * | 8/2002  | Kim et al. | ........ 341/81 |

FOREIGN PATENT DOCUMENTS

| | | | |
|---|---|---|---|
| EP | 1030455 A2 | 8/2000 | ............ H03M 13/27 |
| WO | 99/07076 A2 | 2/1999 | |

(Continued)

OTHER PUBLICATIONS

Jungwoon Lee; Kyung Park; Kilyeon Ryu; Panjong Park; The optimum number of inserted known-bits in the rate matched turbo codes with known bits, Proceedings of the IEEE Region 10 Conference, vol. 1, Sep. 15-17, 1999 pp. 12-14.*

(Continued)

*Primary Examiner* — Joseph D Torres
(74) *Attorney, Agent, or Firm* — King & Spalding L.L.P.

(57) ABSTRACT

A method and apparatus are provided for adapting the data blocks to be supplied to a turbo coder, wherein the adaptation of the block length of the data blocks to the minimum required block length of the turbo coder is insured without the disadvantage of the suboptimum termination of the turbo coder.

17 Claims, 3 Drawing Sheets

(56) References Cited

FOREIGN PATENT DOCUMENTS

| WO | WO 00/64057 | 10/2000 |
| WO | WO 01/05059 | 1/2001 |

OTHER PUBLICATIONS

3GTS 25.212 V3.1.1 (Dec. 1999) $3^{rd}$ Generation Partnership Project; Technical Specification Group Group Radio Access Network; Multiplexing and channel coding (FDD).

* cited by examiner

METHOD FOR ADAPTING THE DATA BLOCKS TO BE SUPPLIED TO A TURBO CODER AND CORRESPONDING COMMUNICATIONS APPARATUS

BACKGROUND OF THE INVENTION

In communications systems, use is made of so-called channel coders for coding the data bits to be transmitted to a corresponding receiver. Via the channel coding, redundant bits are added to the actual data bits and enable more reliable detection of the data bits in the receiver.

With regard to the channel coding, the use of so-called turbo codes is known, the turbo codes also being provided, for example, for the UMTS mobile radio standard ("Universal Mobile Telecommunication System"), currently in the process of standardization.

A turbo coder constitutes a parallel circuit including two convolution coders, an interleaver being connected upstream of one of the two convolution coders, the interleaver temporally reordering the data bits to be coded. The data bits are supplied to the turbo coder blockwise. Since the internal interleaver of the turbo coder is defined only starting from a certain block size, each data block supplied to the turbo coder must have a corresponding minimum size M; i.e., a corresponding minimum number of M data bits. In accordance with the UMTS standard, this minimum block size has been fixed at M=40 bits, for example.

If the data blocks supplied to the turbo coder have a block size which is smaller than the minimum block size M of the turbo coder, the length of the data blocks must be correspondingly adapted before the data blocks are supplied to the turbo coder.

FIG. 3 illustrates a turbo coder in accordance with the prior art, as may be used, for example, in a UMTS mobile radio transmitter.

The turbo coder 2 illustrated includes a first convolution coder 3 and a second convolution coder 4, the data bits of the respective data block to be coded being supplied to the second convolution coder 4 via an interleaver 5 and thereby being temporally reordered. The two convolution coders 3 and 4 are formed by recursive register circuits. At the input of the turbo coder 2, the bits to be coded are tapped off in uncoded form and output as so-called systematic bits X(t). The first convolution coder 3 outputs first parity bits Y(t) corresponding to the coded data bits, while the second convolution coder 4 outputs second parity bits Y'(t). Through corresponding changeover between the individual signal paths X(t), Y(t) and Y'(t), the bit sequence X(0), Y(0), Y'(0), X(1), Y(1), Y'(1), etc., is output as output bit stream at the output of the turbo coder 2.

Once all the data or information bits have been coded, firstly the input switch which is shown in FIG. 3 and is assigned to the upper convolution coder 3 is changed over, with the result that the corresponding feedback path indicated by dashes in FIG. 3 is activated. At the same time, the lower convolution coder 4 is deactivated. The next three values obtained in this way for X(t) and Y(t) are added to the output sequence and serve for the so-called termination of the upper convolution coder 3, as a result of which the convolution coder 3 is brought to a defined initial state again. Afterward, the input switch which is shown in FIG. 3 and is assigned to the lower convolution coder 4 is changed over, with the result that the corresponding feedback path indicated by dashes in FIG. 3 is activated. At the same time, the upper convolution coder 3 is deactivated. The next three values obtained in this way for X'(t) and Y'(t) are likewise added to the output sequence and serve for the termination of the lower convolution coder 4.

In order to adapt the data blocks supplied to the turbo coder 2 to the minimum required block length M of the turbo coder 2, the data bits U(t) of each data block can be filled at the end with predefined bits ("dummy bits"), which have, in particular, the value "0", for example. The insertion of the dummy bits into the data blocks, which is also referred to as "padding", is achieved, in accordance with FIG. 3, via a padding device 1 connected upstream of the turbo coder 2.

The filling of the individual data blocks at the end with dummy bits is disadvantageous, however, insofar as non-constant data bits are generated as a result of this in the event of resetting or termination of the turbo coder 2, which data bits either cannot be utilized or increase the complexity of the receiver.

Therefore, the present invention is directed toward a method for adapting the data blocks to be supplied to a turbo coder and also a corresponding communications apparatus, adaptation of the block length of the data blocks to the minimum required block length of the turbo coder being ensured without the previously described disadvantage of the suboptimum termination of the turbo coder.

SUMMARY OF THE INVENTION

The present invention proposes that the minimum required data block length of the turbo coder is obtained by a corresponding number of bits with a known predefined value ("dummy bits") being placed in a manner preceding the respective data block to be coded. This procedure is extremely simple to implement and does not result in a significant increase in the complexity. Moreover, it is ensured in this way that the resetting (termination) of the turbo coder does not generate further non-constant bits beyond the "tail" bits provided. Furthermore, the added redundant dummy bits later can be utilized, in a simple manner, for improvement of the transmission quality.

For the further processing of the bit stream output by the turbo coder, it may be advantageous if the added dummy bits are at least partly removed again after the turbo coding.

For this purpose, the dummy bits to be removed can be marked and subsequently omitted during the data transmission, it being advantageous, taking account of the separation of the bit stream output by the turbo coder, which separation is to be carried out before the subsequent rate matching, if the dummy bits are always removed in groups of three bits.

Furthermore, the positions of the dummy bits also can be replaced by repetition of individual information-carrying bits (data bits) of the respective bit sequence, in which case the repetition can be effected both cyclically and blockwise.

The problem of adapting the data block length to the minimum required data block length for the turbo coder also can be realized, as an alternative, by the respective data block to be coded being brought to the minimum required block length of the turbo coder by repetition of its data bits, in which case the repetition of the individual bits can be effected both cyclically and blockwise.

The present invention preferably may be used in UMTS mobile radio apparatuses without, however, being restricted to this area of application.

Additional features and advantages of the present invention are described, and will be apparent from, the following detailed description of the invention and the Figures.

DETAILED DESCRIPTION OF THE INVENTION

Figure 1:
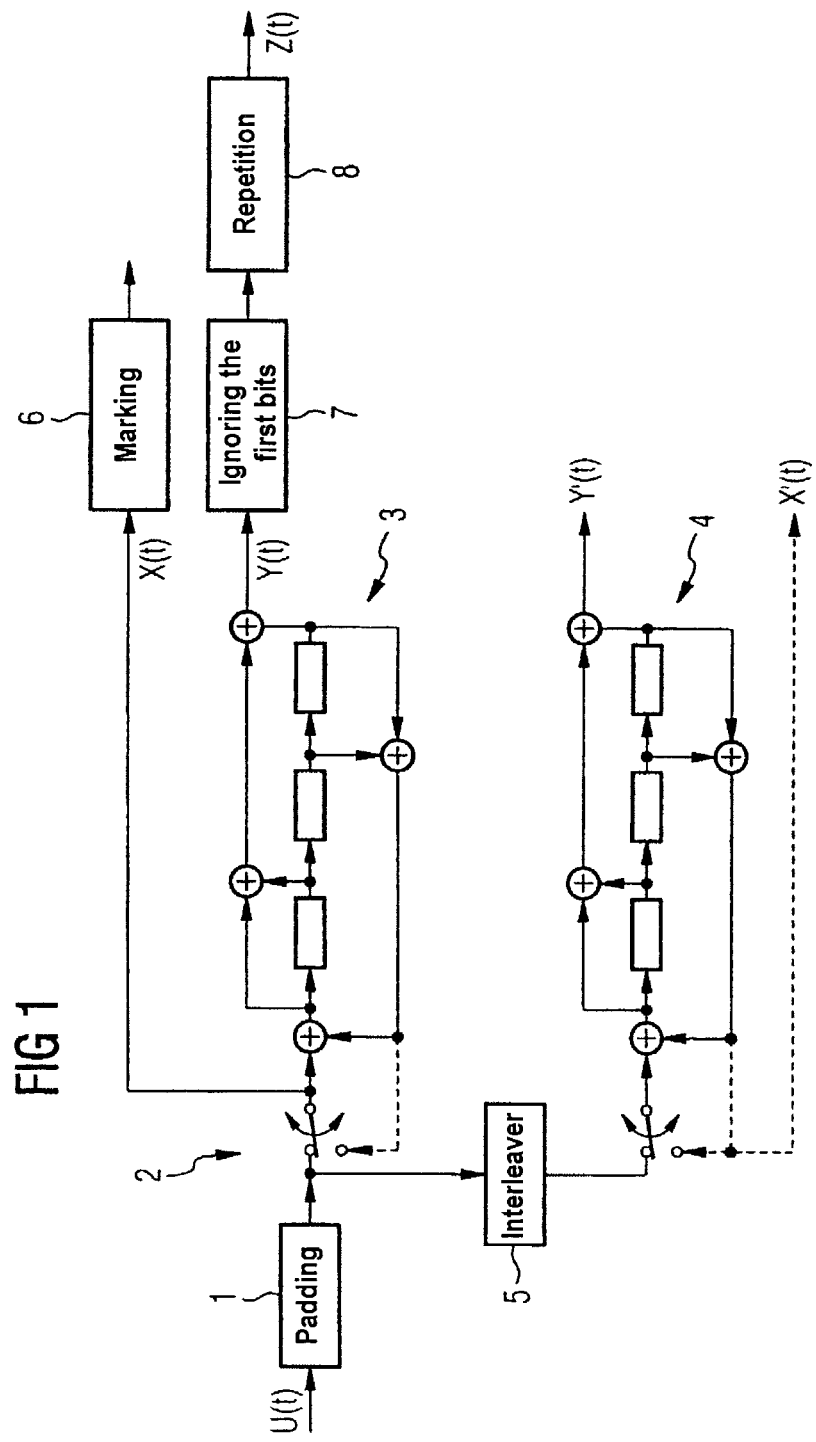
FIG. 1 shows a block diagram of a communications apparatus with a turbo coder in accordance with a first exemplary embodiment of the present invention.

FIG. 1 illustrates a turbo coder 1 as can be used in a communications apparatus according to the present invention; for example, a UMTS mobile telephone. The construction and the method of operation of the turbo coder 2 corresponds to the turbo coder already explained with reference to FIG. 3, and so the discussion thereof will not be repeated at this point. Rather, only the differences between the components shown in FIG. 1 and the turbo coder shown in FIG. 3 are explained below.

Figure 3:
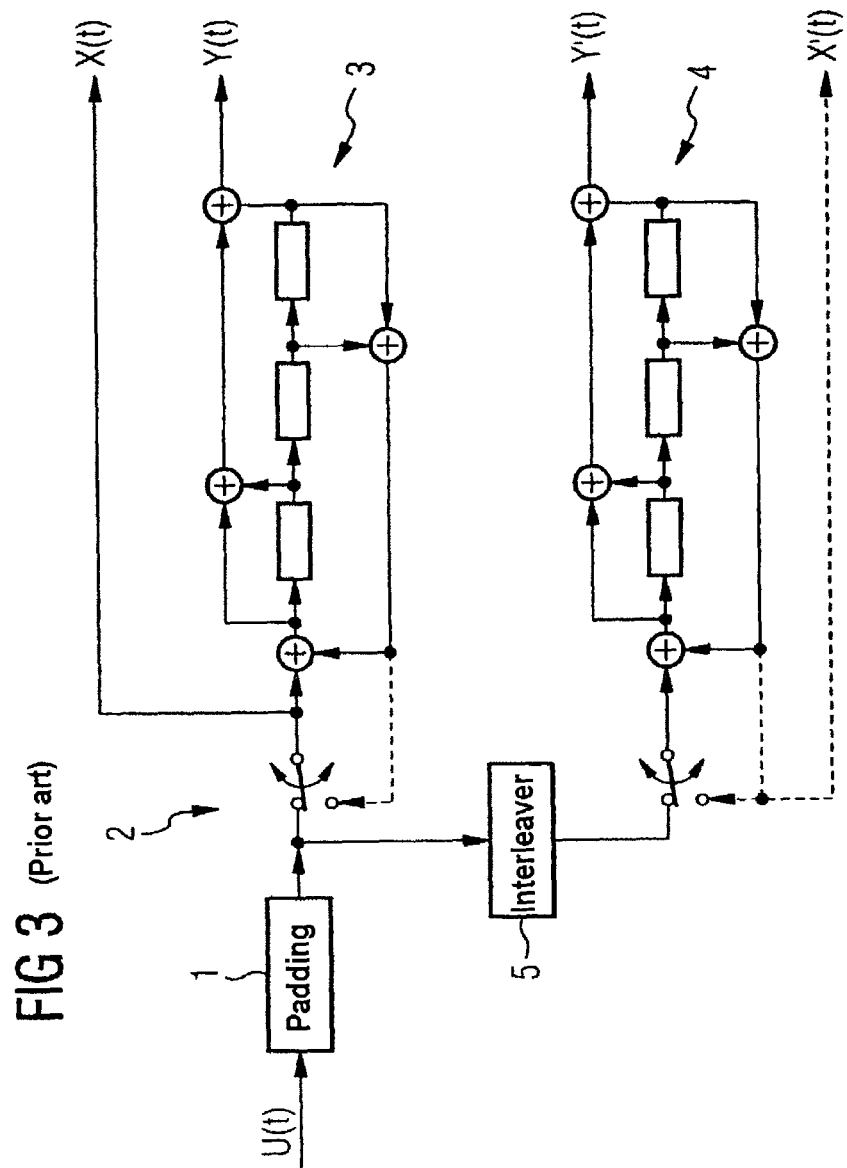
FIG. 3 shows a block diagram of a known communications apparatus with a turbo coder in accordance with the prior art.

Analogously to FIG. 3, a padding device 1 is connected upstream of the turbo coder 2 and fills the individual data blocks to be coded with dummy bits in order to adapt the block length of the data blocks to the minimum required block length M corresponding to the respective turbo coder 2. In contrast to the prior art, however, the padding device 1 is configured in such a way that a corresponding number of dummy bits are placed not in a manner succeeding but rather in a manner preceding each data block to be coded. Consequently, the padded dummy bits are supplied first to the turbo coder 2. This yields the advantage that the resetting of the turbo coder 2 as already explained with reference to FIG. 3 is not impaired. Moreover, more first parity bits Y(t) can be marked as redundant in the case of this procedure compared with the prior art which, as will be explained in more detail below, may be advantageous during the further processing of the coded bit stream.

If the intention is to code a data block of length N<M with the data bits U(0), U(1), U(2) . . . U(N−1), the method of operation of the padding device 1 can be described by the following relationships, where X(0), X(1), X(2) . . . X(i) correspond to the output bits of the padding device 1 or the input bits of the turbo coder 2 (i.e. the systematic bits) and it is assumed that dummy bits with the predefined value "0" are used for filling the data block:

$X(i)=0$ for $0 \leq i < M-N$ $X(i)=U(i-M+N)$ for $M-N \leq i \leq M-1$

This can also be described as:
For i=0 to M−N−1

$X(i)=0$ end for
for i=M−N to M−1

$X(i)=U(i-M+N)$ end for
or with P=M−N as the number of inserted dummy bits with the predefined value "0" as:
for i=0 to P−1

$X(i)=0$ end for
for i=P to M−1

$X(i)=U(i-P)$ end for
or with:
i=k−1 (indexing begins with 0 instead of with 1)
$P=Y_i$
$M=K_i$
$X=o_{i1}$
$U=x_i$
As:
for k=1 to $Y_1$ $o_{t1k}=0$ end for
for k=$Y_i$+1 to $K_i$ $o_{t1k}=x_{t,(k-Y_i)}$ end for The procedure described above has the consequence that both in the case of the systematic bits X(t) and in the case of the first parity bits Y(t), the first M−N bits have the constant value "0" (in the case of UMTS, M=40). By contrast, if the padding were carried out at the end of a data block, then generally the last M−N bits of the first parity bits Y(t) would not have the value "0" and must be considered as data bits, so that they cannot be replaced or removed after the turbo coding.

The knowledge about these bits with the constant value "0" can be used in the receiver of the coded data bits, for example, for improving the reception. Decoders employed in the field of mobile radio technology typically use so-called "soft decision" algorithms for the decoding of the received data bits; i.e., not only the estimated value of the respectively received bit is used, but also, in addition, a significance which is allocated to the respective bit and specifies a probability of the bit actually having the detected value. When using bits known a priori, such as, for example, the dummy bits added in accordance with the present invention, it is possible, in order to improve the reception, for the received signal of a bit known a priori to be ignored and to be replaced for the further processing by the value of an absolutely certainly received bit.

If the padding is carried out in the manner specified above, at the start of the individual data blocks (so-called "front padding"), it is possible to facilitate the implementation of such optimized reception algorithms compared with the case of padding carried out at the end of the data blocks.

The dummy bits inserted by the padding described above are preferably removed again from the output data stream of the turbo coder 2 after the turbo coding. The dummy bits can be removed in the simplest way from the systematic bits X(t) (which correspond to the input bits of the turbo coder 2) and/or the first parity bits Y(t), since, in the case of these bit sequences, the known dummy bits are in each case situated in a data block at the start. By contrast, the second parity bits Y'(t) are calculated from the input bit sequence X(t) after scrambling by the interleaver 5, with the result that the second parity bits Y'(t) contain the known dummy bits and unknown information bits in a disordered manner, which makes it more difficult to identify the known dummy bits.

Depending on which bits are removed again after the turbo coding, it is possible to differentiate between the following cases.

Since the uncoded systematic bits X(t) of the turbo coder 2 as has already been mentioned, have in unchanged fashion the dummy bits placed in a preceding manner during the padding, it is recommended to mark the dummy bits having no information and then to remove them in a later processing. For this reason, in the case of the exemplary embodiment shown in FIG. 1, provision is made of a marking device 6 in the signal path of the systematic bits X(t), which marks the bits X(i) for 0≤i<M−N, so that the marked bits are omitted during the subsequent data transmission.

The first parity bits Y(t) of the turbo coder 2 initially have the value "0" in accordance with the dummy bits inserted during padding. Therefore, the bits Y(i) for 0≤i<M−N also can be marked analogously to the procedure described above for the systematic bits X(t), in order subsequently to be omitted during transmission.

After the turbo coding, the data rate of the bit stream output by the turbo coder 2 is generally adapted ("rate matching"). In this case, the bit stream including the systematic bits X(z), the first parity bits Y(t) and the second parity bits Y(t) is divided into the individual bit sequences X(t), Y(t) and Y'(t) again, this division step also being referred to as separation. Afterward, generally only the data rate of the parity bits Y(t) and Y'(t) is adapted to the data rate required for the data transmission by omitting (puncturing) individual bits. It is equally possible to adapt the data rate by repetition of individual bits, all three bit classes X(t), Y(t) and Y'(t) being repeated in the case of repetition.

The separation requires that the number of bits output by the turbo coder be divisible by the value 3. In order to be able to carry out the separation without changes, it is recommended, therefore, not to mark in principle all known dummy bits and to omit them during the transmission, but rather only in each case dummy bit groups including three dummy bits. By way of example, if eight dummy bits are added during padding, then only six bits in each case would be omitted in the case of this procedure. In this case, it is possible either to omit a number of bits divisible by the value 3 from each class of bits or to omit in total a number of bits divisible by the value 3; for example, seven parity bits Y(t) and eight systematic bits X(t).

In a UMTS transmitter, in the case of this procedure, the three separated bit streams would then not exclusively contain bits of one class after the separation, rather each bit stream would also have second parity bits at the start of a block. The consequence of this is that the second parity bits Y'(t) overall are not punctured completely uniformly during the rate matching. In the case of UMTS, however, a puncturing algorithm which provides alternate puncturing of the first and second parity bits Y(t) and Y'(t) is currently defined for the rate matching. This puncturing algorithm has the effect that the puncturing of the second parity bits which lie at the start of each block are nevertheless punctured relatively uniformly, so that the procedure described above with regard to the marking and omission of the known dummy bits is not harmful for the subsequent rate matching in UMTS communications systems. Furthermore, those second parity bits Y'(t) which are placed in a manner preceding the systematic bits X(t) during the separation are not punctured, as a result of which the effective puncturing rate of the second parity bits Y'(t) is lower at the start and therefore does not impair the performance of the present invention.

As has already been mentioned, care must be taken to ensure that the number of bits of the bit sequences X(t), Y(t), Y'(t) output by the turbo coder 2 are suitable for the algorithms connected downstream in the corresponding communications apparatus; for example, a mobile telephone. In particular, it may be necessary for the above-described separation of the bit stream, composed of the individual bit sequences X(t), Y(t) and Y'(t), for the purpose of rate matching, that the number of output bits per bit sequence X(t), Y(t) and Y'(t) must have the same magnitude (without taking account of the tail bits added during the termination of the turbo coder 2). This precondition would be disturbed by a nonuniform removal (puncturing) or omission of known dummy bits in the individual bit sequences. If this is undesirable, it is appropriate for the dummy bits not simply to be omitted, but rather for their positions to be occupied by other, in particular information-carrying, bits, which are thus transmitted repeatedly. For this purpose, in FIG. 1, provision is made, with regard to the Y(t) signal path, of a device 7 which ignores the known dummy bits contained in the first parity bit sequence Y(t), and of a device 8 which occupies the positions thus liberated in the first parity bit sequence Y(t) with specific information-carrying bits; i.e., these information-carrying bits are repeated.

In order to effect this approach, in the case of the exemplary embodiment shown in FIG. 1, the information-carrying bits of the first parity bit sequence Y(t) (i.e., the bits Y(i) for M−N≤i≤M−1+T), have to be written in a memory, where M designates the minimum required bit length of a data block, N designates the data block length before padding, and T designates the number of tail bits required for the termination of the turbo coder 2. In the case of UMTS communication systems, M=40 and T=6. Afterward, the information-carrying bits written to the memory can be read out cyclically until the desired positions of the dummy bits added during padding have been occupied. For the bits of the bit sequence Z(t) output by the repetition device 8, the following values thus result: Z(I)=S(i mod(N+T)) for 0≤i≤M−1+T, where S(i) designates the information-carrying bits successively written to the memory. Consequently, in the case of this procedure, the information-carrying bits are output as replacement for the corresponding dummy bits in the order S(0), S(1), S(2), . . . , S(N+T−1), S(0), S(1), . . . .

It is equally possible to effect repetition in accordance with the relationship Z(i)=S((I+N−M) mod(N+T)) for 0≤i≤M−1+T (the mod function always generates a positive value; e.g., −9 mod 10=1). The advantage of this procedure is that two alternatives are open to the receiver. In accordance with the first alternative, the receiver can ignore the repeated bits at the start and evaluate only the bits of the last bit block Z(i) where 42−N−T−1≤i≤42−1. In accordance with the second alternative, all of the bits, including the repeated bits, can be evaluated.

In the above formula, the values of the "rear" bits Z(i) where 42−N−T−1≤i≤42−1 are identical to that case in which no repetition is employed, but rather only the front padding according to the present invention. This has the advantage that a receiver which is designed for the front padding and occupies the dummy bits with the soft decision information value by "certainly '0'" before the decoding can also process a signal in the case of which the above-mentioned repetition has been carried out. Although an improvement in the performance is not produced in that case, since the repetition is not utilized, the repetition can be introduced into the corresponding mobile radio standard only in a later stage without compatibility problems with older receivers thus arising. To that end, however, it must be defined for the receiver that it ignores and does not evaluate the known dummy bits or replaces them, this relating, in particular, to the systematic bits X(t) and the first parity bits Y(t).

Instead of a cyclic read-out or repetition of the information-carrying bits, the bits held in the memory also can be repeated blockwise. Although the complexity is slightly increased by the blockwise repetition, by contrast the bit error frequency is reduced upon subsequent application of an algorithm for rate matching or an interleaver.

By way of example, the following algorithm can be used for the blockwise repetition:

$$Z(i) = S\left[\frac{i \cdot (N+T)}{M+T}\right] \text{ for}$$

$0 \leq i \leq M-1+T$; i.e., the information-carrying bits held in the memory are output as replacement for the dummy bits in the order S(0), S(0), . . . , S(0), S(1), S(1), . . . , S(1), S(2), S(2), . . . so that an information-carrying bit is in each case repeated multiply.

As an alternative, the first information-carrying bits could also be repeated $$\left(\frac{M+T}{N+T}\right)$$

times, while the subsequent bits are repeated one time fewer. This procedure is somewhat simpler than the alternative described above, but the first alternative distributes the bits that are transmitted more often more uniformly over all the bits.

Figure 2:
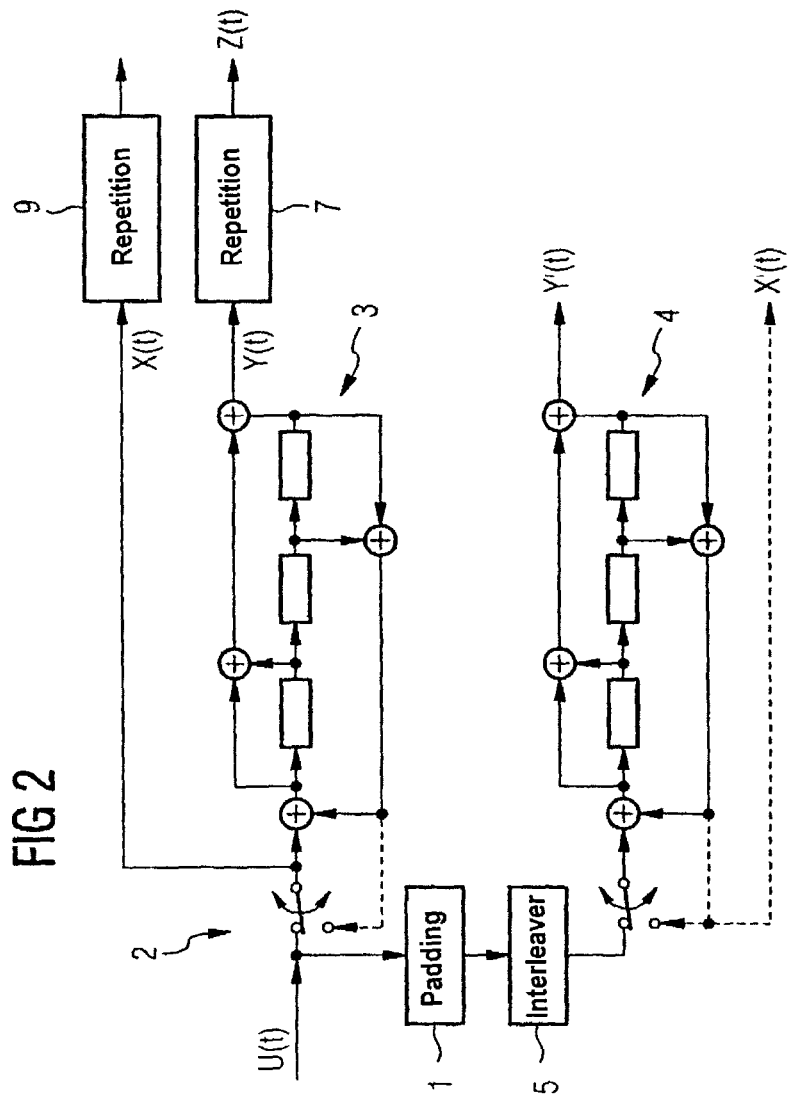
FIG. 2 shows a block diagram of a communications apparatus with a turbo coder in accordance with a second exemplary embodiment of the present invention.

FIG. 2 illustrates a further exemplary embodiment for a turbo coder according to the present invention.

The ignoring of dummy bits is avoided in this exemplary embodiment. Both the first parity bits Y(t) and the systematic bits X(t) are repeated by corresponding repetition devices 8 and 9, while the padding device 1 is only connected upstream of the lower convolution coder 4, which generates the second parity bits Y'(t). The repetition of individual bits of the bit sequences X(t) and Y(t) results in adaptation of the number of bits output in the individual bit sequences X(t), Y(t), Y'(t) per data block. In this exemplary embodiment, the same number of bits is obtained at the output of the turbo coder 2 for all data block sizes N<M (a total of 3·N+12=3·40+12=132 output bits are generated in the case of UMTS).

The problem of adapting the data block length to the minimum data block length M required for the turbo coder 2 also can be addressed, as an alternative to the above-described padding at the start of the data blocks, by the respective data block to be coded being brought to the minimum block length M of the turbo coder 3 by repetition of its data bits U(t) with the aid of a repetition device connected upstream of the turbo coder 2. The turbo coder 3 itself may remain unchanged in the case of this approach. The repetition can be effected both cyclically (i.e., repetition of different bits one after the other) and blockwise (i.e., multiple repetition of one and the same bit).

The present invention has been described above with reference to the use in a transmitter; in particular, a UMTS mobile radio transmitter. It goes without saying, however, that the present invention also can be extended to receivers where a transmission signal generated according to the present invention has to be processed in accordance with the scheme respectively used for adapting the data block length.

Indeed, although the present invention has been described with reference to specific embodiments, those of skill in the art will recognize that changes may be made thereto without departing from the spirit and scope of the present invention as set forth in the hereafter appended claims.

The invention claimed is:

1. A method for adapting data blocks to be supplied to a turbo coder, the method comprising the steps of:
   receiving a plurality of data blocks to be supplied to a turbo coder, each data block having a block size N that is smaller than a minimum block size M defined by the turbo coder;
   for each of the plurality of data blocks to be supplied to the turbo coder, placing M–N additional bits, each having a valve of "0", in a sequence preceding the respective data block to be supplied to the turbo coder for coding data bits of the respective data block, such that the position of the additional "0" bits added to each data block always precedes the respective data block;
   for each of the plurality of data blocks, extending the respective data blocks by adding the M–N additional "0" bits to the respective data block which is to be supplied to the turbo coder for coding the data bits of the respective data block, wherein the number M–N of additional "0" bits placed ahead of each respective data block is determined as a function of the length of that data block such that the extended data block resulting from the addition of the M–N "0" bits meets the minimum block size M defined by the turbo coder;
   receiving the plurality of extended data blocks at the turbo coder and outputting from the turbo coder, for each extended data block, a bit stream including a bit sequence with uncoded systematic bits, a bit sequence with first coded parity bits, and a bit sequence with second coded parity bits;
   for each bit stream output by the turbo coder for a respective extended data block:
      removing i bits from both the uncoded systematic bits and the first coded parity bits of the output bit stream, but not from the second coded parity bits of the output bit stream, wherein 0<i<M–N; and
      after removing the i bits the uncoded systematic bits and from the first coded parity bits of the output bit stream, transmitting the remaining bit stream to a receiver.

2. The method for adapting data blocks to be supplied to a turbo coder as claimed in claim 1, wherein the additional bits added to the data block before the turbo coding are removed from the respective bit sequence generated by the turbo coder in groups of three bits.

3. The method for adapting data blocks to be supplied to a turbo coder as claimed in claim 1, the method further comprising the step of marking the additional bits which are added to the data block and are not to be transmitted, wherein each marked bit is not transmitted during the subsequent data transmission.

4. The method for adapting data blocks to be supplied to a turbo coder as claimed in claim 1, the method further comprising the step of at least partly replacing the additional bits added to the data block before the turbo coding, in the coded bit stream output by the turbo coder, by repetition of at least one data bit of the data block.

5. The method for adapting data blocks to be supplied to a turbo coder as claimed in claim 4, the method further comprising the step of generating, via the turbo coder, depending on the bits of the data block which are supplied to it for turbo coding, a bit sequence with uncoded systematic bits, a bit sequence with first coded parity bits and a bit sequence with second coded parity bits, wherein the additional bits added to the data block before the turbo coding are at least partly replaced, at least in the bit sequence with the systematic bits and/or in the bit sequence with the first parity bits, by repetition of at least one systematic bit and/or at least one first parity bit of the data block.

6. The method for adapting data blocks to be supplied to a turbo coder as claimed in claim 5, the method further comprising the steps of:
successively writing to a memory the data bits of the respective bit sequence that are to be replaced; and
cyclically reading out the data bits from the memory so as to replace the desired additional bits which have been added to the data block.

7. The method for adapting data blocks to be supplied to a turbo coder as claimed in claim 6, wherein a value of the bits $Z(i)$ of the turbo coder in the respective bit sequence which are to be replaced is determined in accordance with one of the following relationships:

$$Z(i)=S(I \bmod(N+T)) \text{ for } 0 \leq i \leq M-1+T \text{ or}$$

$$Z(i)=S(I+N-M)\bmod(N+T)) \text{ for } 0 \leq i \leq M-1+T,$$

where $S(i)$ designates the data bits of the respective data block that are written to the memory, i designates the a respective bit position in the data block, N designates an original length of the data block, M designates a minimum required number of bits per data block for the turbo coding, and T designates a number of tail bits added to the respective bit sequence after the turbo coding.

8. The method for adapting data blocks to be supplied to a turbo coder as claimed in claim 5, the method further comprising the step of writing to a memory the data bits of the respective bit sequence in which the additional bits added to the data block are intended to be replaced, wherein in each case one data bit is read out from the memory and repeated as replacement for the plurality of additional bits, which have been added to the corresponding data block, at corresponding positions in the respective bit sequence.

9. The method for adapting data blocks to be supplied to a turbo coder as claimed in claim 8, wherein for each data block to be supplied to the turbo coder, a value of the bits $Z(i)$ of the turbo coder in the respective bit sequence which are intended to be replaced is determined in accordance with the following relationship:

$$Z(i) = S\left(\frac{i \cdot (N+T)}{M+T}\right)$$

for $0 \leq i \leq M-1+T$ where $S(i)$ designates the data bits of the respective data block that are written to the memory, i designates a respective bit position in the data block, and T designates a number of tail bits added to the respective bit sequence after the turbo coding.

10. The method for adapting data blocks to be supplied to a turbo coder as claimed in claim 8, wherein a first group of data bits stored in the memory are repeated $$\left(\frac{M+T}{N+T}\right)$$

times as replacement for the corresponding additional bits, while a second group of data bits stored in the memory are repeated $$\left[\left(\frac{M+T}{N+T}\right)-1\right]$$

times,
where T designates a number of tail bits added to the respective bit sequence after the turbo coding.

11. The method for adapting data blocks to be supplied to a turbo coder as claimed in claim 1, the method further comprising the steps of:
generating, via the turbo coder:
a bit sequence with encoded systematic bits,
a bit sequence with first coded parity bits via a first convolution coder, and
a bit sequence with second coded parity bits via a second convolution coder;
supplying the data bits of the original data block to the first convolution coder and supplying the data bits, with the additional bits placed sequentially before the data bits, to the second convolution coder; and
repeating at least one bit of the bit sequence with the systematic bits and at least one bit of the bit sequence with the first parity bits in the corresponding bit sequence; and
adapting the number of bits output for the data word to be coded in the corresponding bit sequence to the number of bits in the bit sequence with the second parity bits.

12. A communications apparatus, comprising:
a turbo coder; and
a data block adapting device configured to:
receive a plurality of data blocks to be supplied to a turbo coder, each data block having a block size N that is smaller than a minimum block size M defined by the turbo coder;
and M−N additional bits, each having a valve of "0", to each of the plurality of data blocks to be supplied to the turbo coder for coding data bits of the data blocks,
wherein each of a plurality of data blocks is extended by the M−N additional "0" bits and is output by the data block adapting device, and wherein the number M−N of additional "0" bits placed ahead of each respective data block is determined as a function of the length of that data block such that each of a plurality of data blocks is extended by the M−N additional "0" bits to meets the minimum block size M defined by the turbo coder,
wherein the data block adapting device is configured such that it places the M−N additional "0" bits in a sequence preceding each of the plurality of data blocks, such that the position of the M−N additional "0" bits added to each data block always precedes the respective data block,
wherein the turbo coder is configured to receive the plurality of extended data blocks at the turbo coder and, for each extended data block, output a bit stream including a bit sequence with uncoded systematic bits, a bit sequence with first coded parity bits, and a bit sequence with second coded parity bits,
a marking device configured to, for each bit stream output by the turbo coder for a respective extended data block, mark i bits of both the uncoded systematic bits and the first coded parity bits of the bit stream, but not of the second coded parity bits of the bit stream, wherein 0<i<M−N, and a transmission unit configured to, for each bit stream marked by the marking device:
remove the marked i bits from both the uncoded systematic bits and first coded parity bits of the bit stream, but not from the second coded parity bits of the bit stream, and
after removing the marked i bits, transmit the remaining bit stream to a receiver.

13. A communications apparatus as claimed in claim 12, wherein the communications apparatus is a mobile radio transmission apparatus.

14. A communications apparatus as claimed in claim 12, wherein the communications apparatus is configured for receiving and evaluating a bit stream that is processed by another communications apparatus and is subsequently transmitted to the communications apparatus.

15. A communications apparatus as claimed in claim 14, wherein the turbo coder of the transmitting, communications apparatus, depending on the bits of the data block which is supplied to it for turbo coding in each case and is extended by the additional bits, generates a bit sequence with uncoded systematic bits, a bit sequence with first coded parity bits and a bit sequence with second coded parity bits, wherein the communications apparatus configured for reception does not evaluate the bits inserted by the transmitting communications apparatus at least in the bit sequence with the uncoded systematic bits and/or in the bit sequence with the first coded parity bits.

16. A method for adapting data blocks, comprising the steps of:
receiving a plurality of data blocks to be supplied to a turbo coder, each data block having a block size N that is smaller than a minimum block size M defined by the turbo coder;
for each of the plurality of data blocks to be supplied to the turbo coder, placing M−N additional "0" bits in a sequence preceding the respective data block to be supplied to a turbo coder for coding data bits of the respective data block, such that the position of the M−N additional "0" bits added to each data block always precedes its respective data block;
for each of the plurality of data blocks, extending the respective data blocks by adding the M−N additional "0" bits to the respective data block which is to be supplied to the turbo coder for coding the data bits of the respective data block, wherein the number M−N of additional "0" bits placed ahead of each respective data block is determined as a function of the length of that data block such that the extended data block resulting therefrom from the addition of the M−N "0" bits meets the minimum block size M defined by the turbo coder;
for each of the plurality of extended data blocks, supplying the sequence of M−N additional "0" bits and the N bits of the respective extended data block to the turbo coder; and
for each of the plurality of extended data blocks, outputting by the turbo coder a bit stream including, a bit sequence with uncoded systematic bits, a bit sequence with first coded parity bits, and a bit sequence with second coded parity bits;
for each of the plurality of extended data blocks, prior to transmitting the respective output bit stream to a data recipient, removing from the output bit stream a number of bits equal to i from the uncoded systematic bits and from the first coded parity bits, but not from the second coded parity bits, wherein $0<i<M-N$; wherein the number of removed bits, i, is an integer multiple of three even if the number of M−N additional "0" bits is not an integer multiple of three.

17. The method of claim 16, wherein:
if the number M−N of additional bits is an integer multiple of three, none of the additional bits are transmitted to the data recipient;
if the number M−N of additional bits is one more than an integer multiple of three, exactly one of the additional bits is transmitted to the data recipient; and
if the number M−N of additional bits is two more than an integer multiple of three, exactly two of the additional bits are transmitted to the data recipient.

\* \* \* \* \*